(12) United States Patent
Miyanaga et al.

(10) Patent No.: US 8,702,865 B2
(45) Date of Patent: Apr. 22, 2014

(54) AL$_x$GA$_{1-x}$N CRYSTAL SUBSTRATE

(71) Applicant: Sumitomo Electric Industries, Ltd., Osaka (JP)

(72) Inventors: Michimasa Miyanaga, Itami (JP); Naho Mizuhara, Itami (JP); Hideaki Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 34 days.

(21) Appl. No.: 13/621,854

(22) Filed: Sep. 18, 2012

(65) Prior Publication Data

US 2013/0015414 A1    Jan. 17, 2013

Related U.S. Application Data

(62) Division of application No. 12/305,969, filed as application No. PCT/JP2007/062073 on Jun. 15, 2007, now Pat. No. 8,293,012.

(30) Foreign Application Priority Data

Jun. 20, 2006    (JP) .................................. 2006-170302

(51) Int. Cl.
*C30B 23/00*    (2006.01)
*H01L 31/036*    (2006.01)
*H01B 1/02*    (2006.01)

(52) U.S. Cl.
USPC ........................... 117/88; 257/75; 252/519.14

(58) Field of Classification Search
None
See application file for complete search history.

(56) References Cited

U.S. PATENT DOCUMENTS

| 5,399,313 | A | * | 3/1995 | Ross et al. | ................... 420/448 |
| 2005/0161697 | A1 | * | 7/2005 | Nakahata et al. | ............. 257/103 |
| 2007/0215887 | A1 | * | 9/2007 | D'Evelyn et al. | ............... 257/94 |

* cited by examiner

*Primary Examiner* — Bijay Saha
(74) *Attorney, Agent, or Firm* — James W. Judge

(57) ABSTRACT

Affords Al$_x$Ga$_{1-x}$N crystal growth methods, as well as Al$_x$Ga$_{1-x}$N crystal substrates, wherein bulk, low-dislocation-density crystals are obtained. The Al$_x$Ga$_{1-x}$N crystal (0<x≤1) growth method is a method of growing, by a vapor-phase technique, an Al$_x$Ga$_{1-x}$N crystal (10), characterized by forming, in the growing of the crystal, at least one pit (10p) having a plurality of facets (12) on the major growth plane (11) of the Al$_x$Ga$_{1-x}$N crystal (10), and growing the Al$_x$Ga$_{1-x}$N crystal (10) with the at least one pit (10p) being present, to reduce dislocations in the Al$_x$Ga$_{1-x}$N crystal (10).

2 Claims, 4 Drawing Sheets

AL$_x$GA$_{1-x}$N CRYSTAL SUBSTRATE

BACKGROUND OF THE INVENTION

1. Technical Field

The present invention relates to Al$_x$Ga$_{1-x}$N (0<x≤1, ditto hereinafter) crystal growth methods and Al$_x$Ga$_{1-x}$N crystal substrates advantageously employed in light-emitting devices, electronic devices, semiconductor sensors and other semiconductor devices.

2. Description of the Related Art

Group III nitride crystals such as GaN crystals and AlN crystals find tremendous utility as materials for forming semiconductor devices including light-emitting devices, electronic device, and semiconductor sensors. Improving the semiconductor device characteristics mandates that the III nitride crystals be bulk, and be low in dislocation density.

Therein, the AlN crystals are generally grown by sublimation, with there being growth by natural crystalline nucleation without employing an undersubstrate, and growth using hetero-substrates, in which crystal is grown onto an SiC substrate or other nonnative substrate (substrate whose chemical makeup differs from that of the grown crystal, ditto hereinafter) serving as an undersubstrate (cf., for example, Patent Documents 1 through 3).

In growth by natural crystalline nucleation, however, not employing undersubstrates leads to not being able to control crystal-growth orientation and not being able to carry out stabilized crystal growth, which lowers reproducibility, though crystal of low dislocation density and favorable crystallinity is obtained. Furthermore, because the crystal growth is generally carried out at high temperatures (of, for example, 2300° C. or more) the distribution of heat in the crystal-growth ambient is broad and makes the grown AlN crystal susceptible to cracking, which is prohibitive of forming bulk AlN crystal.

On the other hand, in growth employing nonnative substrates, employing a nonnative substrate (such as a SiC substrate) of large-diametric-span yields bulk AlN crystal having a diametric span equal to the nonnative substrate, and facilitates control of the crystal-growth orientation, enabling stable crystal growth to be carried out. However, due to the lattice mismatch between the nonnative substrate and the AlN crystal, the dislocation density is great, which is detrimental to the crystallinity and causes stress-induced strain in the crystal.

Accordingly, with the conventional sublimation techniques, growing bulk, low-dislocation-density AlN crystal has been challenging.

In GaN crystal growth, meanwhile, it has been reported that bulk, low-dislocation-density GaN crystal through HVPE or another vapor-phase technique may be obtained by providing a mask layer with windows onto an undersubstrate such as a sapphire or SiC substrate, and then adjusting the crystal-growth conditions to form in the growth surface of the crystal pits having a plurality of facets, and carrying out the crystal growth with the pits left present in the surface (cf., for example, Patent Document 4).

Patent Document 1: Detailed Description in U.S. Pat. No. 5,858,086.
Patent Document 2: Detailed Description in U.S. Pat. No. 6,296,956.
Patent Document 3: Detailed Description in U.S. Pat. No. 6,001,748.
Patent Document 4: Japanese Unexamined Pat. App. Pub. No. 2001-102307.

As far as Al$_x$Ga$_{1-x}$N crystal (0<x≤1), which contains Al as a constituent element, is concerned, however, unlike with GaN crystal, if vapor-phase crystal growth is carried out with a window-perforated mask layer being formed onto the undersubstrate, Al$_x$Ga$_{1-x}$N polycrystal also is produced on the mask layer, which prevents the formation of the multifaceted pits, such that bulk, low-dislocation-density crystal cannot be obtained.

BRIEF SUMMARY OF THE INVENTION

An object of the present invention is to make available Al$_x$Ga$_{1-x}$N crystal growth methods and Al$_x$Ga$_{1-x}$N crystal substrates, whereby bulk, low-dislocation-density crystals may be obtained.

One aspect of the present invention is a method of growing an Al$_x$Ga$_{1-x}$N crystal (0<x≤1) by a vapor-phase technique, the Al$_x$Ga$_{1-x}$N crystal growth method being characterized by forming, in the growing of the crystal, at least one pit having a plurality of facets on the major growth plane of the Al$_x$Ga$_{1-x}$N crystal and growing the Al$_x$Ga$_{1-x}$N crystal with the at least one pit being present, to reduce dislocations in the Al$_x$Ga$_{1-x}$N crystal.

In an Al$_x$Ga$_{1-x}$N crystal growth method involving the present invention, a linear area for concentrating dislocations can be present in the pit, stretching from its bottom part substantially perpendicularly to the major growth plane. Furthermore, it is possible to have the density in the linear dislocation-concentrating area be 10$^5$ cm$^{-2}$ or less. Further, the pit can be formed by the incorporation of impurities in the crystal-growth ambient. Herein, it is possible to have the impurity be at least one Group-IVb element. And it is possible to have the vapor-phase technique be sublimation. It is also possible to have the ratio of the total area of the plane of the pit openings to the total area of the major growth plane, following crystal growth, be 30% or more. Furthermore, it is possible to grow a second Al$_x$Ga$_{1-x}$N crystal onto a crystalline surface of the Al$_x$Ga$_{1-x}$N crystal in which after crystal growth the ratio of the total area of the plane of the pit opening to the total area of the major growth plane is 30% or more, and have the ratio of the total area of the plane of a pit opening in the second Al$_x$Ga$_{1-x}$N crystal to the total area of its major growth plane, following crystal growth, be less than 30%.

The present invention is also an Al$_x$Ga$_{1-x}$N crystal substrate, having a planar major face, produced by processing the surface of an Al$_x$Ga$_{1-x}$N crystal obtained by an above-described growth method. The present invention further is an Al$_x$Ga$_{1-x}$N crystal (0<x≤1) substrate, the Al$_x$Ga$_{1-x}$N crystal substrate including a high-dislocation-density part centered on a linear dislocation-concentrating area, and a low-dislocation-density part in which the dislocation density is less than 2×10$^6$ cm$^{-2}$, with the surface area of the low-dislocation-density part along the major face being 30% or more of the total surface area of the major face. The present invention is also an Al$_x$Ga$_{1-x}$N crystal (0<x≤1) substrate, the Al$_x$Ga$_{1-x}$N crystal substrate including a high-dislocation-density part centered on a linear dislocation-concentrating area, and a low-dislocation-density part in which the dislocation density is less than 2×10$^6$ cm$^{-2}$, with the high-dislocation-density part sandwiched between a first portion and a second portion of the low-dislocation-density part, and with the maximum angular discrepancy in the crystallographic orientation of the first portion and the crystallographic orientation of the second portion being 50 arcsec or less.

The present invention affords Al$_x$Ga$_{1-x}$N crystal growth methods, as well as Al$_x$Ga$_{1-x}$N crystal substrates, wherein bulk, low-dislocation-density crystal is obtained.

LEGEND

Figure 1:
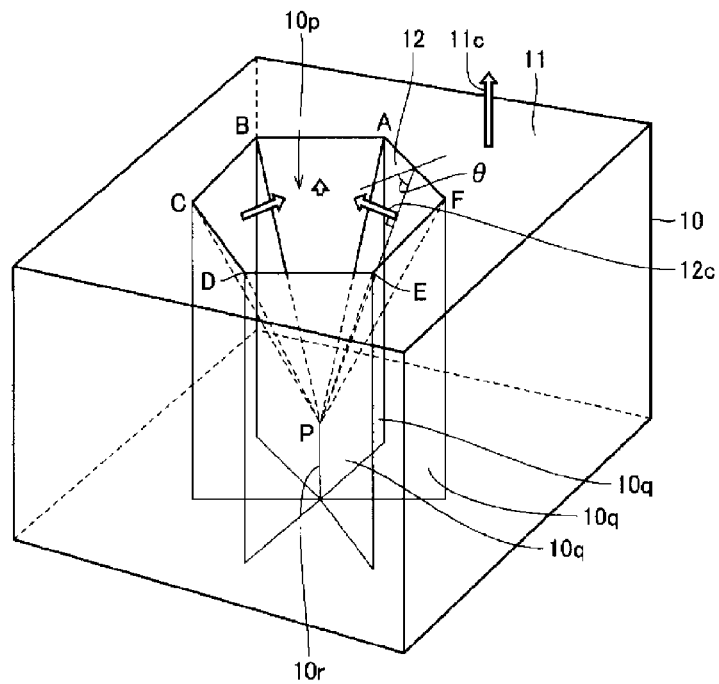
FIG. 1 is an outline oblique view representing one embodiment mode of an $Al_xGa_{1-x}N$ crystal growth method involving the present invention.

1: $Al_yGa_{1-y}N$ precursor
9: undersubstrate
10, 20: $Al_xGa_{1-x}N$ crystals
10$p$, 20$p$: pits
10$q$: planar dislocation-concentrating area
10$r$, 20$r$, 30$r$: linear dislocation-concentrating areas
10$s$, 20$s$: plane of opening
11, 21: major growth planes
11$c$, 12$c$: crystal-growth directions
12, 22: facets
12$d$: dislocation propagating direction
13: surface
30: $Al_xGa_{1-x}N$ crystal substrate
30$h$: high-dislocation-density part
30$k$: low-dislocation-density part
30$ka$: first portion
30$kb$: second portion
31: major face
50: sublimation furnace
51: reaction vessel
51$a$: $N_2$ gas inlet
51$c$: $N_2$ gas exhaust outlet
52: crucible
52$a$: crucible main body
52$b$: crucible cover
52$c$: exhaust outlet
54: heating element
55: high-frequency heating coils
56: radiation thermometers

DETAILED DESCRIPTION OF THE INVENTION

Embodiment Mode 1

Figure 2:
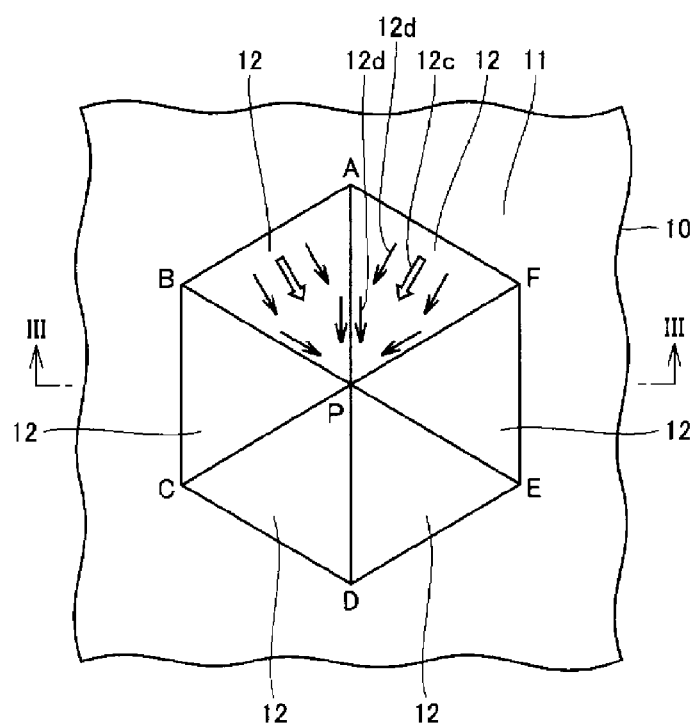
FIG. 2 is an outline plan view representing the one embodiment mode of the $Al_xGa_{1-x}N$ crystal growth method involving the present invention.
Figure 3:
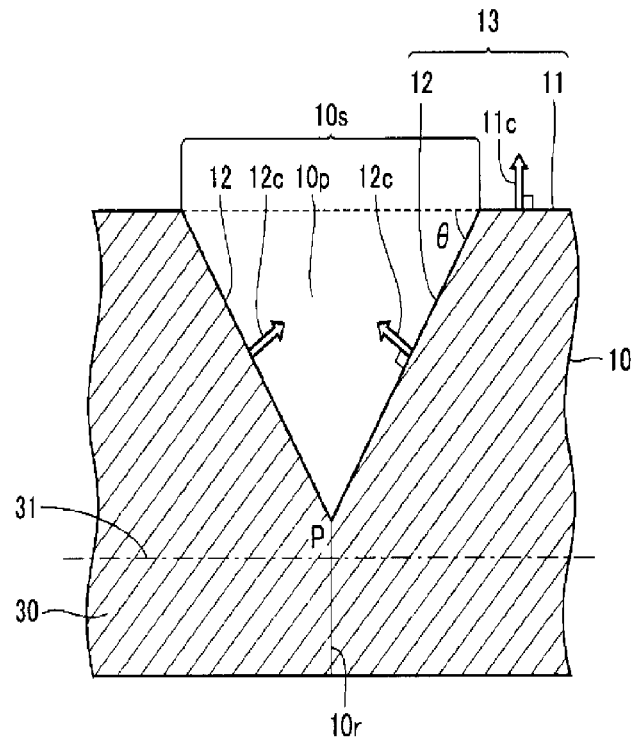
FIG. 3 is an outline sectional view taken along the line III-III in FIG. 2, seen in the direction of the arrows.

Referring to FIGS. 1 through 3, an $Al_xGa_{1-x}N$ crystal growth method involving the present invention is a method of growing an $Al_xGa_{1-x}N$ crystal ($0<x\leq1$) by a vapor-phase technique, the growth method being characterized by forming, in the growing of the crystal, at least one pit 10$p$ having a plurality of facets 12 on the major growth plane 11 of the $Al_xGa_{1-x}N$ crystal 10 and growing the $Al_xGa_{1-x}N$ crystal 10 with the at least one pit 10$p$ being present, to reduce dislocations in the $Al_xGa_{1-x}N$ crystal 10.

According to the present embodiment mode, in the very growth of $Al_xGa_{1-x}N$ crystal, by adjusting the crystal-growth conditions to form in the growing of the crystal the at least one pit 10$p$ having a plurality of facets 12, on the major growth plane 11 of the $Al_xGa_{1-x}N$ crystal 10, and growing the $Al_xGa_{1-x}N$ crystal 10 with the at least one pit 10$p$ being present, dislocations in the $Al_xGa_{1-x}N$ crystal 10 can be reduced. The growth method in the present embodiment mode is preferably employed particularly in the growth of AlN crystal, among $Al_xGa_{1-x}N$ crystals. A specific explanation will be made below.

Referring to FIGS. 1 and 2, in the present embodiment mode, by adjusting the crystal-growth conditions, onto the c-plane (a {0001} plane, ditto hereinafter), which is the major growth plane 11, of the $Al_xGa_{1-x}N$ crystal 10, one or more pits 10$p$ having a plurality of facets 12 possessing plane indices apart from that of the c-plane is formed. It should be understood that the {0001} planes are the general term for the planes crystallographically equivalent to the (0001) plane, and include not only the (0001) plane but also the (000-1) plane.

Herein, form of the pit 10$p$ is not particularly limited, but because the $Al_xGa_{1-x}N$ crystal 10 is hexagonal, the pit 10$p$ tends to take the form of a hexagonal pyramid represented by P-ABCDEF. Furthermore, the facets 12 forming the pit 10$p$ are not particularly limited, but often turn out to be s-planed ({10-11} planes, ditto hereinafter). It should be understood that the {10-11} planes are the general term for the planes crystallographically equivalent to the (10-11) plane. That is, the pit 10$p$ illustrated in FIGS. 1 and 2 is formed by the plurality of facets 12 whose plane indices differ.

Furthermore, an m-plane (a {10-10} plane, ditto hereinafter) is sometimes included in the facets 12. In such instances, the planes themselves of the facets 12 take on a three-dimensional geometry. It should be understood that the {10-10} planes are the general term for the planes crystallographically equivalent to the (10-10) plane.

Moreover, in the present embodiment mode, with the at least one pit 10$p$ being present, the $Al_xGa_{1-x}N$ crystal 10 is grown. In the growth, for example, in that of the facets 12 which is formed by a triangular face PFA in FIGS. 1 and 2, crystal grows in a direction (crystal-growth direction 12$c$ in FIG. 1) substantially perpendicular to the triangular face PFA, and dislocations also propagate in a direction substantially parallel to the crystal-growth direction. Herein, "a substantially perpendicular direction or parallel direction" means a direction recognized as perpendicular or parallel in an actual crystal, and is not limited to mathematically perpendicular or parallel.

Herein, referring to FIG. 2, the crystal-growth direction 12$c$ and dislocation propagating direction 12$d$ in that of the facets 12 which is formed by the triangular face PFA (hereinafter, PFA facet) are directed toward the bottom part P of the pit 10$p$, seen from the direction perpendicular to the major growth plane. In the same manner, in that of the facets 12 which is formed by the triangular face PAB (hereinafter, PAB facet) adjacent to the PFA facet, the crystal-growth direction and dislocation-propagating direction are directed toward the bottom part P of the pit 10$p$.

Herein, dislocations in the vicinity of the border between the PFA and PAB facets concentrate on the borderline AP. On the borderline AP, dislocations whose Burger's vectors are of opposite sign and equal in magnitude act to cancel each other out. The remaining dislocations propagate along the borderline AP toward the bottom part P of the pit 10$p$. In this way, dislocations within regions where pits 10$p$ have formed concentrate, either via the borderlines AP, BP, CP, DP, EP, and FP between the facets 20, or directly, into the bottom part P of the pit 10p. Herein, in the bottom part P of the pit 10p, dislocations whose Burger's vectors are of opposite sign and equal in magnitude act to cancel each other out. The remaining dislocations are left in the bottom part P of the pit 10p.

The explanation with reference to FIG. 2 is made viewed from the direction perpendicular to the major growth plane 11. In actuality, the facets 12 each grow also in the direction (crystal-growth direction 11c on the major growth plane in FIG. 1) perpendicular to the major growth plane 11, and thus, referring to FIGS. 1 and 3, dislocations in a region in which a pit 10p forms concentrate in a plane (planar dislocation-concentrating area 10q), including each of the borderlines between the facets 20, substantially perpendicular to the major growth plane 11, and concentrate on a line (dislocation-concentrating liner portion 10r) extending from the bottom part P of the pit 10p in the direction substantially perpendicular to the major growth plane 11. In these portions, dislocations whose Burger's vectors are of opposite sign and equal in magnitude act to cancel each other out, thereby making it possible to reduce dislocations in the $Al_xGa_{1-x}N$ crystal 10.

In the present embodiment mode, the density in the linear dislocation-concentrating area 10r is preferably $10^5$ cm$^{-2}$ or less, and is more preferably $10^4$ cm$^{-2}$ or less, with $10^3$ cm$^{-2}$ or less being still more preferable. If the density in the linear dislocation-concentrating area 10r is over $10^5$ cm$^{-2}$, the dislocation-reduction effect in the $Al_xGa_{1-x}N$ crystal 10 deteriorates.

In the present embodiment mode, impurities are preferably incorporated into the crystal-growth ambient in order to form the above pit 10p. Incorporating impurities into the crystal-growth ambient enables forming the plurality of facets 12 as stable crystal-growth planes, in addition to the c-plane, which becomes the major growth plane 11, making it possible to form a pit 10p having the plurality of facets 12.

The reason why in the present embodiment mode the $Al_xGa_{1-x}N$ crystal 10 grows without the pits 10p extinguishing is because the pit 10p openings tend to expand. Referring to FIGS. 1 and 3, letting the crystal-growth rate in the direction (crystal-growth direction 11c on the major growth plane 11) substantially perpendicular to the major growth plane 11 be V, and the angle formed by the major growth plane 11 and facets 12 be θ, then when the crystal-growth rate $V_F$ on a facet is V sin θ, the pit 10p is invariant in size, and will grow in the direction substantially perpendicular to the major growth plane 11 at the rate V.

The method of incorporating impurities into a crystal-growth ambient is not particularly limited, so a technique of introducing together with a carrier gas a gas containing impurities into a crystal-growth vessel, or of arranging impurities together with a crystal precursor is preferably employed, for example.

Herein, from the perspective of transforming the stable crystal-growth plane in the growing of the crystal, at least one Group-IVb element is contained as the impurity. In particular, carbon (C) is preferably contained as the impurities. C as the impurities can be incorporated into a crystal-growth ambient by the technique of introducing together with a carrier gas a C-containing gas (for example, an oxide gas such as a $CO_2$ gas, a chloride gas such as a $CCl_4$ gas, a nitride gas such as HCN gas, or a hydroxide gas such as a $CH_4$ gas) into a crystal-growth vessel, or of arranging together with a crystal precursor C-containing impurities (for example, a single substance such as solid carbon, or metal carbide such as $Al_4C_3$) in a crystal-growth vessel. Herein, if impurities are introduced with a C-containing gas, concentration of the impurities in a crystal-growth ambient is represented by their flow ratio in the gas, and if the impurities are incorporated into a precursor, the concentration is represented by their mass ratio.

Furthermore, the concentration of impurities incorporated into a crystal-growth ambient is preferably between from 1 ppm to 15 mass %, at least in the initial stage of crystal growth. Herein, "initial stage of crystal growth" means the period from the start of the crystal growth until the first half of the period required for the crystal growth has passed. The concentration of impurities being lower than 1 ppm inhibits formations of pits that are the above-noted objective, or is otherwise prohibitive of growing crystal thick while sustaining the pits. With the concentration of impurities being higher than 15 mass %, crystal growth can be impaired. From these perspectives, the concentration of impurities incorporated into a crystal-growth ambient is preferably between 100 ppm and 3 mass % inclusive. Herein, if the gas containing impurities is introduced together with a carrier gas, the concentration of impurities in the crystal-growth ambient can be measured according to the flow-ratio of the gas containing impurities to the carrier gas, and if the impurities are arranged in a precursor, the concentration can be measured according to the content (mass %) of the impurities in the precursor.

Moreover, in order to readily form the pits 10p, not only control of impurities in a crystal-growth ambient but also control of crystal-growth temperature and temporal control of the impurities and temperature are preferably carried out. The crystal-growth temperature depends on type of vapor-phase technique, but in sublimation, the temperature is preferably between from 1600° C. to 2500° C. Crystal-growth temperatures lower than 1600° C. deteriorate crystallinity or lower the crystal-growth rate, and crystal-growth temperatures higher than 2500° C. are prohibitive of stable crystal growth.

Also, the growth method in the present embodiment mode has an effect of lessening internal stress and cracking in the $Al_xGa_{1-x}N$ crystal, originating principally in lattice mismatch during the crystal growth onto a nonnative substrate. Particularly, in Formula (1) representing the relationship between crystal thickness x and a dislocation density y, with the crystal thickness being up to 5 mm after the crystal growth, $$y = A \cdot \exp(k \cdot x) \qquad (1)$$

if coefficient of inclination k is $-20 < k < -4$, a more advantage reduction of dislocation density and lessening of cracking and internal stress can be carried out. It will be appreciated that in Formula (1), A represents the intercept coefficient.

The $Al_xGa_{1-x}N$ crystal growth method in the present embodiment mode may be applied to every sort of vapor-phase technique—to sublimation, HVPE, etc.—as long as it is a vapor-phase technique and is not contrary to the objectives of the present invention. With $Al_xGa_{1-x}N$ crystal ($0 < x \leq 1$), since high temperature regions are believed to facilitate gaining ideal crystallinity, sublimation is preferable.

Figure 5:
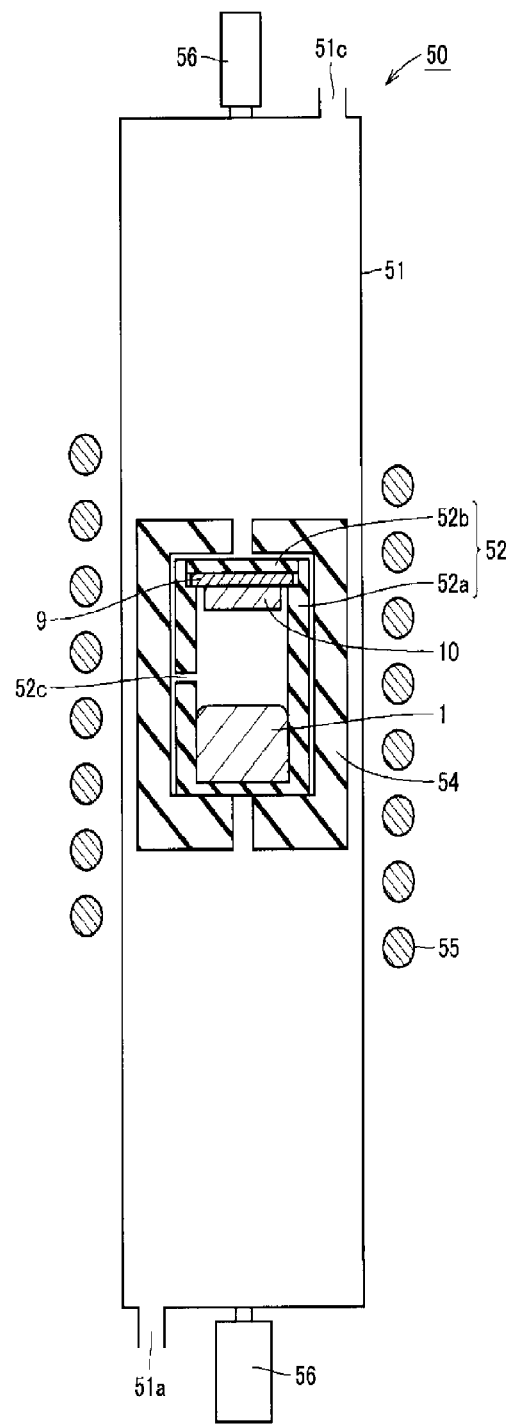
FIG. 5 is a schematic diagram illustrating a sublimation furnace employed in $Al_xGa_{1-x}N$ crystal growth in the present invention.

Herein, referring to FIG. 5, "sublimation" means a method of sublimating or vaporizing an $Al_yGa_{1-y}N$ precursor 1 such as $Al_yGa_{1-y}N$ powder ($0 < y \leq 1$), and then by re-solidifying it onto, for example, an undersubstrate 9 to grow an $Al_xGa_{1-x}N$ crystal 10. In the crystal growth by sublimation, a vertical high-frequency heating sublimation furnace 50 as illustrated is FIG. 5 is employed, for example. In the central part of a reaction vessel 51 in the vertical sublimation furnace 50, a tungsten carbide (WC) crucible 52 (configured with a crucible main body 52a and a crucible cover 52b) having an exhaust outlet 52c is arranged as the crystal-growth vessel, and a heating element 54 is disposed surrounding the crucible 52 so that ventilation from the crucible interior to its exterior is secured. Furthermore, on the central part of the exterior of the reaction vessel 51, high-frequency heating coils 55 for heating the heating element 54 for heating the crucible 52 are disposed. Moreover, the ends of the reaction vessel 51 are provided respectively with a $N_2$ gas inlet 51a for passing a $N_2$ gas into the reaction vessel 51 unoccupied by the crucible 52, and a $N_2$ gas exhaust outlet 51c, and with radiation thermometers 56 for measuring temperatures of the under side and top side of the crucible 52.

Figure 4:
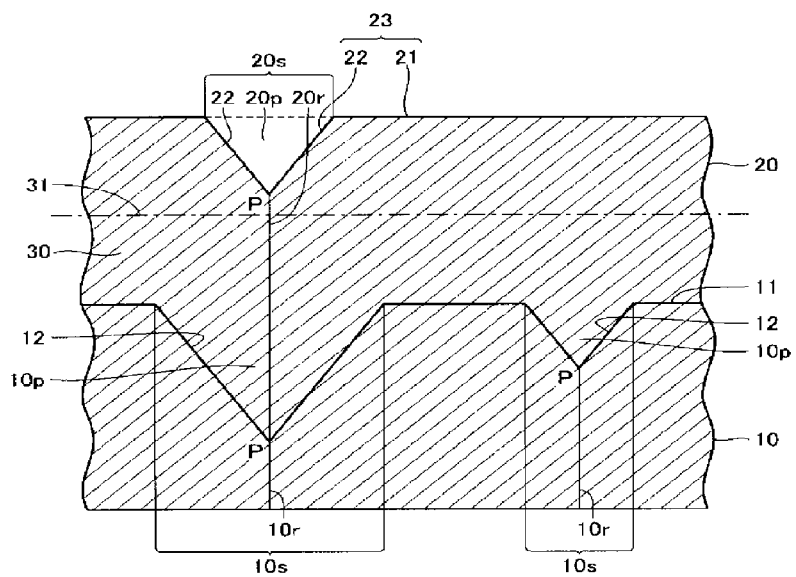
FIG. 4 is an outline sectional view representing another embodiment mode of the $Al_xGa_{1-x}N$ crystal growth method involving the present invention.

Referring to FIG. 4, the $Al_xGa_{1-x}N$ crystal 10 may be formed employing the above vertical sublimation furnace 50, in the following manner, for example. The undersubstrate 9 is stored in the top part of the crucible 52, and the $Al_yGa_{1-y}N$ precursor 1 such as $Al_yGa_{1-y}N$ powder is stored in the under part of the crucible 52. A $N_2$ gas is passed into the reaction vessel 51, and meanwhile temperature inside the crucible 52 is raised with the high-frequency heating coils 55. Temperature in the crucible 52 on the side where the $Al_yGa_{1-y}N$ precursor 1 is stored is kept higher than temperature on the side where the undersubstrate 9 is stored to sublimate $Al_xGa_{1-x}N$ from the $Al_yGa_{1-y}N$ precursor 1, and on the undersubstrate 9 arranged in the top part of the crucible 52, the $Al_xGa_{1-x}N$ is re-solidified to grow the $Al_xGa_{1-x}N$ crystal 10.

Herein, during the growth of the $Al_xGa_{1-x}N$ crystal 10, having the temperature in the crucible 52 as a crystal-growth vessel on the side where the $Al_yGa_{1-y}N$ precursor 1 is stored be at the 1600° C. to 2400° ° C. level, and making the temperature in the top part of the crucible 52 on the side where the undersubstrate 9 is stored be some 10° C. to 300° C. lower than the temperature on the side where the $Al_yGa_{1-y}N$ precursor 1 is stored, leads to efficient formation of the $Al_xGa_{1-x}N$ crystal 10. Herein, during the crystal growth, together with the $N_2$ gas, as a carrier gas, whose partial pressure is approximately 101.3 hPa to 5000 hPa, and whose flow rate is approximately 5 sccm to 5000 sccm (1 sccm means flow rate of a gas per one minute in 1 $cm^3$ in normal conditions—that is, 1013 hPa, and 0° C.), passing as an impurity-containing gas a gas containing impurities, whose partial pressure is approximately 50 hPa to 2500 hPa, and whose flow rate is 0.005 sccm to 250 sccm into the reaction vessel 51 unoccupied by the crucible 52 enables introducing the impurities by an extent of 1 ppm to 5 mass % into the crystal-growth ambient in the crucible 52 as a crystal-growth vessel. Moreover, in the introduction of impurities into the crucible 52, a substance containing impurities may be arranged in the crucible 52 together with the $Al_yGa_{1-y}N$ precursor 1, in place of the introduction of a gas containing impurities.

Referring to FIG. 3, in the $Al_xGa_{1-x}N$ crystal growth method in the present embodiment mode, the post-crystal-growth ratio of the total area of the plane of the pit 10p openings 10s to the total area of the major growth plane 11 is preferably 30% or more, and is more preferably 50% or more. The greater that the percentage of the total area of the plane of the pit 10p openings 10s is, the greater will be the pit-formation region on the major growth plane 11, and thus in the larger region dislocations in the $Al_xGa_{1-x}N$ crystal can be reduced. Having the ratio of the total area of the plane of the pit 10p openings 10s to the total area of the major growth plane 11 be 30% or more heightens the dislocation-reduction effectiveness in the $Al_xGa_{1-x}N$ crystal, leading to formation of $Al_xGa_{1-x}N$ crystals having further enhanced crystallinity.

Herein, the crystal-growth conditions for growing the $Al_xGa_{1-x}N$ crystal 10 to have the ratio of the total area of the plane of the pit 10p openings 10s to the total area of the major growth plane 11 after crystal growth be 30% or more are not particularly limited, but it is preferable that the concentration of impurities be between from 1 ppm to 30 mass %, and that the substrate temperature be 1600° C. or more to less than 2000° C.

Referring to FIG. 4, also in the $Al_xGa_{1-x}N$ crystal growth method in the present embodiment mode, it is possible to grown a second $Al_xGa_{1-x}N$ crystal 20 onto the surface of the $Al_xGa_{1-x}N$ crystal 10 in which after the crystal growth the ratio of the total area of the plane of the pit openings 10s to the total area of the major growth plane 11 is 30% or more, and have the post-crystal-growth ratio of the total area of the plane of a pit opening 20s in the second $Al_xGa_{1-x}N$ crystal 20 to the total area of its major growth plane 21 be less than 30%. Herein, in FIG. 4, on the major growth plane 11 of the $Al_xGa_{1-x}N$ crystal 10, pits 10p having a plurality of facets 12 form, and on the major growth plane 21 of the second $Al_xGa_{1-x}N$ crystal 20, a pit 20p having a plurality of facets 22 forms. With the growth method, at least a part of the pits 10p in the $Al_xGa_{1-x}N$ crystal 10 contracts and/or disappears. Therefore, linear dislocation-concentrating areas decrease, and thus the second $Al_xGa_{1-x}N$ crystal 20 in which dislocation density is low, and dislocation concentration has been lessened can be obtained.

Herein, crystal-growth conditions for growing the second $Al_xGa_{1-x}N$ crystal 20 to have the post-crystal-growth ratio of the total area of the plane of the pit 20p opening 20s to the total area of the major growth plane 11 of the second $Al_xGa_{1-x}N$ crystal 20 be less than 30% are not particularly limited, but it is preferable that the concentration of impurities be 15 mass % or less, and the substrate temperature be between 2000° C. or more to less than 2500° C.

Embodiment Mode 2

Referring to FIGS. 3 and 4, an $Al_xGa_{1-x}N$ crystal substrate (0<x≤1) involving the present embodiment mode is produced by processing the surfaces 13 and 23 of $Al_xGa_{1-x}N$ crystals 10 and 20 formed by the growth method in Embodiment Mode 1, and has a planar major face 31. The $Al_xGa_{1-x}N$ crystal substrate 30 is the substrate produced from the $Al_xGa_{1-x}N$ crystals 10 and 20 in which dislocations have been remarkably reduced, and having enhanced crystallinity, the crystals 10 and 20 being formed by the growth method in Embodiment Mode 1, and is preferably employed as a semiconductor device substrate.

Herein, processing the surfaces 13 and 23 of the $Al_xGa_{1-x}N$ crystals 10 and 20 means that the surfaces 13 and 23 of the formed $Al_xGa_{1-x}N$ crystals 10 and 20 are cut, ground and/or polished so as to be planar plane 30. It should be understood that for the cutting, grinding and polishing, publicly known methods may be employed.

Figure 6A:
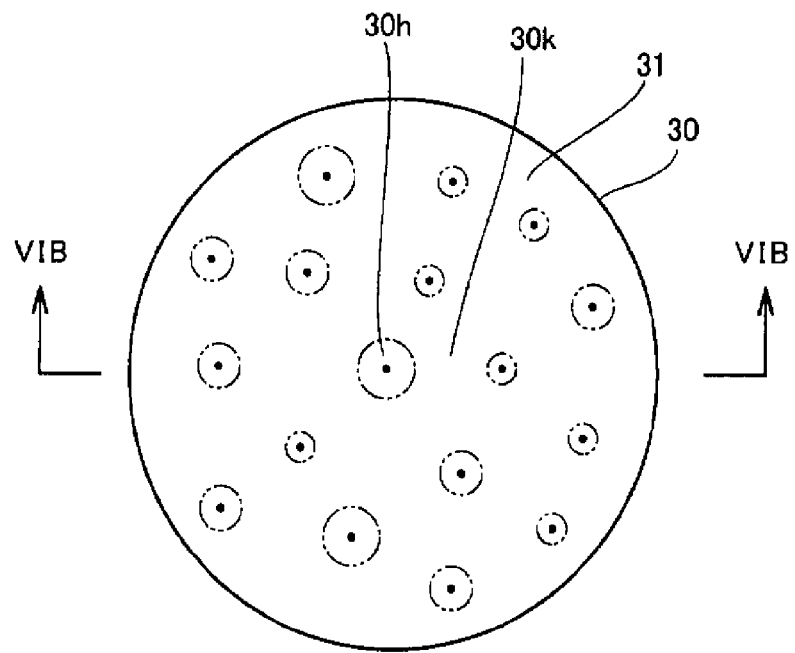
FIG. 6A is an outline plan view illustrating one embodiment mode of an $Al_xGa_{1-x}N$ crystal substrate involving the present invention.
Figure 6B:
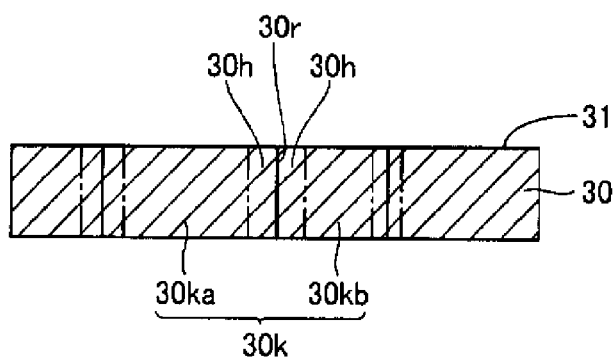
FIG. 6B is an outline sectional view taken along the line VIB-VIB in FIG. 6A, seen in the direction of the arrows.

Furthermore, referring to FIG. 6, an $Al_xGa_{1-x}N$ crystal substrate (0<x≤1) involving the present embodiment mode includes: high-dislocation-density parts 30h centered on a linear dislocation-concentrating area 30r; and a low-dislocation-density part 30k in which dislocation density is less than $2 \times 10^6$ $cm^{-2}$, with area of the low-dislocation-density part 30k on the major face 31 being 30% or more of the total area of the major face 31. Bringing dislocation density in the low-dislocation-density part 30k to less than $2 \times 10^6$ $cm^{-2}$, preferably to less than $2 \times 10^5$ $cm^{-2}$ makes it possible to more preferably employ the $Al_xGa_{1-x}N$ crystal substrate as a semiconductor device substrate. Also, bringing area of the low-dislocation-density part 30k on the major face 31 to 30% or more of, preferably to 50% or more of, the total area of the major face 31 makes it possible to more preferably employ the $Al_xGa_{1-x}N$ crystal substrate as a semiconductor device substrate. It should be understood that dislocation density in the $Al_xGa_{1-x}N$ crystal substrate can be measured by etch pit, cathodoluminescence (CL), observation under a fluorescence microscope, or other methods.

In the $Al_xGa_{1-x}N$ crystal substrate 30 in the present embodiment mode, variation in dislocation density is continuous, and borders between the high-dislocation-density parts 30h and the low-dislocation-density part 30k are not exactly clear. Therefore, percentage of area of the low-dislocation-density part 30k in which dislocation density is less than $2 \times 10^6$ cm$^{-2}$ to the major-face total area is calculated by measuring dislocation densities in a plurality of measuring zones arranged at regular intervals on the major face to divide the number of those of the measuring zones in which dislocation density measures less than $2 \times 10^6$ cm$^{-2}$ by the total number of the measuring zones on the major face.

Furthermore, referring to FIG. 6, an $Al_xGa_{1-x}N$ crystal substrate ($0 < x \leq 1$) involving the present embodiment mode includes: high-dislocation-density parts 30h centered on a linear dislocation-concentrating area 30r; and a low-dislocation-density part 30k in which dislocation density is less than $2 \times 10^6$ cm$^{-2}$, with the high-dislocation-density parts 30h intervening between a first portion 30ka and a second portion 30kb of the low-dislocation-density part 30k, and with the maximum angular discrepancy in the crystallographic orientation of the first portion 30ka and the crystallographic orientation of the second portion 30kb being 50 arcsec or less. Because regardless of presence of the high-dislocation-density parts 30h centered on the linear dislocation-concentrating area 30r, the maximum angular discrepancy in crystallographic orientation between the first portion 30ka and the second portion 30kb between which the high-dislocation-density parts 30h intervene is a small 50 arcsec, the $Al_xGa_{1-x}N$ crystal substrate 30 in the present embodiment mode can be more preferably employed as a semiconductor device substrate.

Herein, the maximum angular discrepancy of crystallographic orientation between the first and second portions 30ka and 30kb in between which the high-dislocation-density parts 30h are sandwiched is determined in the following manner. The crystallographic orientations (for example, in the a1-axis, a2-axis, a3-axis and c-axis directions) of the first and second portions are each measured by X-ray diffraction. The maximum angular discrepancy is therein defined as the largest angle of discrepancy in crystallographic orientation between the first and second portions.
Embodiments
Embodiment 1

Referring to FIG. 5, a SiC substrate whose diametric span was 1 inch (2.54 cm) was arranged as an undersubstrate 9 in the top part of a WC crucible 52, and AlN powder was arranged as an $Al_yGa_{1-y}N$ precursor 1 in the under part of the crucible 52. Subsequently, a $N_2$ gas at 900 hPa partial pressure, and at 200 sccm flow rate was passed into a reaction vessel 51, and meanwhile the crucible 52 was heated with high-frequency heating coils 55 so that temperature in the crucible 52 on the side where the $Al_yGa_{1-y}N$ precursor 1 (AlN powder) was arranged was brought to 2100° C., and temperature on the side where the undersubstrate 9 (SiC substrate) was arranged was brought to 2000° C. to grow an AlN crystal for 30 hours. Into the crucible 52 in the reaction vessel 51, as a gas containing impurities, a $CO_2$ gas was passed at 5 sccm in one hour from the start of the crystal growth, at gradually decreasing flow rate in 20 hours from when the one hour had passed, and at 0.05 sccm after the 20 hours had passed.

The AlN crystal grown in this manner was a bulk 1 inch (2.54 cm) in diametric span×10 mm in thickness, and was confirmed to be single crystal by X-ray diffraction (XRD, ditto hereinafter). On a major growth plane of the AlN single crystal, a plurality of pits in the form of a hexagonal pyramid formed. Their photograph was taken with a stereomicroscope from the direction perpendicular to the major growth plane. Percentage of the total area of the plane of the pit openings in the total area of the major growth plane, determined from the photograph was 90%. Moreover, the surface density of the linear dislocation-concentrating areas in the bottom parts P of the pits, determined from the aforementioned photograph, was 30 cm$^{-2}$.

The surface of the AlN single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than $2 \times 10^6$ cm$^{-2}$ was 18. Thus, area of the low-dislocation-density part in which dislocation density was less than $2 \times 10^6$ cm$^{-2}$ was 90% of the total area of the major face. Furthermore, average dislocation density was a very low $3 \times 10^4$ cm$^{-2}$. Moreover, as a result of measuring by X-ray diffraction deviation angles of crystallographic orientations in first and second portions lying at diametrically opposed positions to each other in the low-dislocation-density part with the high-dislocation-density parts intervening between the portions, the maximum angular discrepancy of 20 arcsec was measured between the crystallographic orientation and the c-axis (the [0002] direction) in each of the portions.

COMPARATIVE EXAMPLE 1

Temperature in a crucible 52 on the side where an $Al_yGa_{1-y}N$ precursor 1 (AlN powder) was arranged was brought to 2100° C., and temperature on the side where an undersubstrate 9 (SiC substrate) was arranged was brought to 2000° C., to grow an AlN crystal in the same manner as in Embodiment 1, apart from not passing a $CO_2$ gas as a gas containing impurities into the crucible 52 in a reaction vessel 51. The formed AlN crystal was 1 inch (2.54 cm) in diametric span×5 mm in thickness, and was confirmed to be single crystal by XRD.

The surface of the AlN single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than $2 \times 10^6$ cm$^{-2}$ was one. Thus, area of the low-dislocation-density part in which dislocation density was less than $2 \times 10^6$ cm$^{-2}$ was 5% of the total area of the major face. Furthermore, average dislocation density was $5 \times 10^8$ cm$^{-2}$. Moreover, as a result of measuring by X-ray diffraction deviation angles of crystallographic orientations in first and second portions lying at diametrically opposed positions to each other in the low-dislocation-density part with the high-dislocation-density parts intervening between the portions, the maximum angular discrepancy of 150 arcsec was measured between the crystallographic orientation and the c-axis (the [0002] direction) in each of the portions.
Embodiment 2

Referring to FIG. 5, an AlN crystal 1 inch (2.54 cm) in diametric span, formed in Embodiment 1 was polished, and then was arranged as an undersubstrate 9 in the top part of a WC crucible 52. In the under part of the crucible 52, AlN powder was arranged as an $Al_yGa_{1-y}N$ precursor 1. Herein, the AlN crystal was arranged so that a second AlN crystal grew onto a major growth plane on which a plurality of pits in the form of a hexagonal pyramid formed. Subsequently, an $N_2$ gas at 2000 hPa partial pressure, and at 200 sccm flow rate was passed into a reaction vessel 51, and meanwhile the crucible 52 was heated with high-frequency heating coils 55 so that temperature in the crucible 52 on the side where the $Al_yGa_{1-y}N$ precursor 1 (AlN powder) was arranged was brought to 2100° C., and temperature on the side where the undersubstrate 9 (AlN substrate) was arranged was brought to 2000° C. to grow the second AlN crystal for 15 hours. Into the crucible 52 in the reaction vessel 51, as a gas containing impurities, a $CO_2$ gas was passed at 0.01 sccm from the start of, to the end of, the crystal growth.

The second AlN crystal grown in this manner was a bulk 1 inch (2.54 cm) in diametric span×3 mm in thickness, and was confirmed to be single crystal by XRD. Also on a major growth plane of the second AlN single crystal, a plurality of pits in the form of a hexagonal pyramid formed. Their photograph was taken with a stereomicroscope from the direction perpendicular to the major growth plane. Percentage of the total area of the plane of the pit openings in the total area of the major growth plane, determined from the photograph was 5%. Moreover, the surface density of the linear dislocation-concentrating areas in the bottom parts P of the pits, determined from the aforementioned photograph, was 1 $cm^{-2}$.

Additionally, the surface of the second AlN single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than $2×10^6$ $cm^{-2}$ was 19. Thus, area of the low-dislocation-density part in which dislocation density was less than $2×10^6$ $cm^{-2}$ was 95% of the total area of the major face. Furthermore, average dislocation density was a very low $2×10^4$ $cm^{-2}$. Moreover, as a result of measuring by X-ray diffraction deviation angles of crystallographic orientations in first and second portions lying at diametrically opposed positions to each other in the low-dislocation-density part with high-dislocation-density parts intervening between the portions, the maximum angular discrepancy of 15 arcsec was measured between the crystallographic orientation and the c-axis (the [0002] direction) in each of the portions.

Embodiment 3

Referring to FIG. 5, a SiC substrate having 1 inch (2.54 cm) diametric span was arranged as an undersubstrate 9 in the top part of a WC crucible 52, and AlN and GaN powders which had been mixed at molar ratio of 7:3 were arranged as a $Al_yGa_{1-y}N$ precursor 1 in the under part of the crucible 52. Subsequently, a $N_2$ gas at 900 hPa partial pressure, and at 200 sccm flow rate was passed into a reaction vessel 51, and meanwhile the crucible 52 was heated with high-frequency heating coils 55 so that temperature in the crucible 52 on the side where the $Al_yGa_{1-y}N$ precursor 1 (AlN and GaN powders) was arranged was brought to 2100° C., and temperature on the side where the undersubstrate 9 (SiC substrate) was arranged was brought to 2000° C. to grow an $Al_xGa_{1-x}N$ crystal for 30 hours. Into the crucible 52 in the reaction vessel 51, as a gas containing impurities, a $CO_2$ gas was passed at 3.5 sccm for one hour from the start of the crystal growth, at a gradually decreasing flow rate for 20 hours from when the one hour had passed, and at 0.035 sccm after the 20 hours had passed.

The $Al_xGa_{1-x}N$ crystal grown in this manner was a bulk 1 inch (2.54 cm) in diametric span×7 mm in thickness, and was confirmed to be single crystal by XRD, and to have chemical atomic ratio of $Al_{0.8}Ga_{0.2}N$ by X-ray photoelectron spectroscopy (XPS, ditto hereinafter). On a major growth plane of the $Al_{0.8}Ga_{0.2}N$ single crystal, a plurality of pits in the form of a hexagonal pyramid formed. Their photograph was taken with stereomicroscope from the direction perpendicular to the major growth plane. Percentage of the total area of the plane of the pit openings in the total area of the major growth plane, determined from the photograph was 80%. Moreover, the surface density of the linear dislocation-concentrating areas in the bottom parts P of the pits, determined from the aforementioned photograph, was 200 $cm^{-2}$.

The surface of the $Al_{0.8}Ga_{0.2}N$ single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than $2×10^6$ $cm^{-2}$ was 15. Thus, area of the low-dislocation-density part in which dislocation density was less than $2×10^6$ $cm^{-2}$ was 75% of the total area of the major face. Furthermore, average dislocation density was a very low $6×10^5$ $cm^{-2}$. Moreover, as a result of measuring by X-ray diffraction deviation angles of crystallographic orientations in first and second portions lying at diametrically opposed positions to each other in the low-dislocation-density part with high-dislocation-density parts intervening between the portions, the maximum angular discrepancy of 25 arcsec was measured between the crystallographic orientation and the c-axis (the [0002] direction) in each of the portions.

COMPARATIVE EXAMPLE 2

Temperature in the crucible 52 on the side where an $Al_yGa_{1-y}N$ precursor 1 (AlN and GaN powders) was arranged was brought to 2100° C., and temperature on the side where an undersubstrate 9 (SiC substrate) was arranged was brought to 2000° C., to grow an $Al_xGa_{1-x}N$ crystal in the same manner as in Embodiment 2, apart from not passing a $CO_2$ gas as a gas containing impurities into the crucible 52 within a reaction vessel 51. The formed AlN crystal was 1 inch (2.54 cm) in diametric span×3 mm in thickness, and was confirmed to be single crystal by XRD, and to have chemical atomic ratio of $Al_{0.8}Ga_{0.2}N$ by XPS.

The surface of the $Al_{0.8}Ga_{0.2}N$ single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than $2×10^6$ $cm^{-2}$ was 0. Thus, area of the low-dislocation-density part in which dislocation density was less than $2×10^6$ $cm^{-2}$ was 0% of the total area of the major face. Furthermore, average dislocation density was $1×10^9$ $cm^{-2}$. Moreover, as a result of measuring by X-ray diffraction deviation angles of crystallographic orientations in first and second portions lying at diametrically opposed positions to each other in the low-dislocation-density part with high-dislocation-density parts intervening between the portions, the maximum angular discrepancy of 2000 arcsec was measured between the crystallographic orientation and the c-axis (the [0002] direction) in each of the portions.

Embodiment 4

Referring to FIG. 5, an $Al_{0.8}Ga_{0.2}N$ crystal having 1 inch (2.54 cm) diametric span, formed in Embodiment 3 was arranged as an undersubstrate 9 in the top part of a WC crucible 52, and AlN and GaN powders that had been mixed at molar ratio of 7:3 were arranged as an $Al_yGa_{1-y}N$ precursor 1 in the under part of the crucible 52. Herein, the $Al_{0.8}Ga_{0.2}N$ crystal was arranged so that a second $Al_xGa_{1-x}N$ crystal grew onto a major growth plane on which a plurality of pits in the form of a hexagonal pyramid formed. Subsequently, an $N_2$ gas at 2000 hPa partial pressure, and at 200 sccm flow rate was passed into a reaction vessel 51, and meanwhile the crucible 52 was heated with high-frequency heating coils 55 so that temperature in the crucible 52 on the side where the $Al_yGa_{1-y}N$ precursor 1 (AlN and GaN powders) was arranged was brought to 2200° C., and temperature on the side where the undersubstrate 9 ($Al_{0.8}Ga_{0.2}N$ crystal) was arranged was brought to 2100° C. to grow the second $Al_xGa_{1-x}N$ crystal for 15 hours. Into the crucible 52 within the reaction vessel 51, as a gas containing impurities, a $CO_2$ gas was passed at 0.01 sccm from the start of, to the end of, the crystal growth.

The second $Al_xGa_{1-x}N$ crystal grown in this manner was a bulk 1 inch (2.54 cm) in diametric span×7 mm in thickness, and was confirmed to be single crystal by XRD, and to have chemical atomic ratio of $Al_{0.8}Ga_{0.2}$ by XPS. On the major growth plane of the $Al_{0.8}Ga_{0.2}N$ single crystal, a plurality of pits in the form of a hexagonal pyramid formed. Their photograph was taken with a stereomicroscope from the direction perpendicular to the major growth plane. Percentage of the total area of the plane of the pit openings in the total area of the major growth plane, determined from the photograph was 1%. Moreover, the surface density of the linear dislocation-concentrating areas in the bottom parts P of the pits, determined from the aforementioned photograph, was 0.5 cm$^{-2}$.

Furthermore, the surface of the second $Al_{0.8}Ga_{0.2}N$ single crystal was polished to form a planar major face, and then the major face was immersed into molten KOH at 250° C. to form etch pits. In 20 measuring zones (100 μm×100 μm) arranged at regular intervals on the major face, dislocation densities in the zones were measured. The number of those of the measuring zones in which dislocation density was less than 2×10$^6$ cm$^{-2}$ was 18. Thus, area of the low-dislocation-density part in which dislocation density was less than 2×10$^6$ cm$^{-2}$ was 90% of the total area of the major face. Furthermore, average dislocation density was a very low 4×10$^5$ cm$^{-2}$. Moreover, as a result of measuring by X-ray diffraction deviation angles of crystallographic orientations in first and second portions lying at diametrically opposed positions to each other in the low-dislocation-density part with high-dislocation-density parts intervening between the portions, the maximum angular discrepancy of 20 arcsec was measured between the crystallographic orientation and the c-axis (the [0002] direction) in each of the portions.

As is clear from comparisons between Comparative Example 1 and Embodiment 1, and between Comparative Example 2 and Embodiment 3, in the method of growing an $Al_xGa_{1-x}N$ crystal (0<x≤1) by a vapor-phase technique, forming in the crystal growth at least one pit having a plurality of facets onto a major growth plane of the $Al_xGa_{1-x}N$ to grow the $Al_xGa_{1-x}N$ crystal, with the at least one pit being present enabled reducing dislocations in the $Al_xGa_{1-x}N$ crystal.

Furthermore, as is clear from comparisons between Embodiments 1 and 2, and between Embodiments 3 and 4, growing an $Al_xGa_{1-x}N$ crystal so that percentage of the total area of plane of the pit openings in the total area of a major growth plane after the crystal growth was brought to 30% or more to grow onto the $Al_xGa_{1-x}N$ crystal a second $Al_xGa_{1-x}N$ crystal so that percentage of the total area of plane of the pit openings in the total area of a major growth plane after the second crystal growth was brought to less than 30% led to formation of the second $Al_xGa_{1-x}N$ crystal in which dislocation density was lower, and dislocation concentration was made more moderate, compares with the $Al_xGa_{1-x}N$ crystal.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. An $Al_xGa_{1-x}N$ crystal (0<x≤1) substrate, the substrate defining a major growth plane, with the major growth plane having been processed into a planar major face, the $Al_xGa_{1-x}N$ crystal substrate grown by sublimation onto an undersubstrate under a controlled ambient in a reaction vessel, by
   setting up in the reaction vessel a crystal-growth ambient containing suitable $Al_xGa_{1-x}N$ crystal-growth precursors and a flowing carrier gas;
   heating the undersubstrate to a temperature of from 1600° C. to less than 2000° C.;
   introducing into the ambient at least one Group-IVb element in gaseous form, together with the carrier gas, at a flow rate of 0.005 sccm to 250 sccm or in solid form together with the $Al_xGa_{1-x}N$ precursors, so as to incorporate into the ambient at a concentration of from 1 ppm to 15 mass %, for a predetermined period of time extending at least from the start of the growing of the crystal until half the period required for the crystal growth has passed, impurities constituted by the at least one Group-IVb element and thereby form, in the growing of crystal onto the undersubstrate, plural-faceted pits with hexagonal openings in the major face, the pits defining bottoms from which linear dislocation-concentrating areas extend into the $Al_xGa_{1-x}N$ substrate substantially perpendicularly to the major growth plane; and
   controlling the crystal-growth temperature, the concentration of the ambient impurities, and the predetermined time period during which the impurities are introduced into the ambient so as to grow the $Al_xGa_{1-x}N$ crystal such that the ratio of the total area of the plane of the pit openings to the total area of the major face is at least 30%;
   the $Al_xGa_{1-x}N$ crystal substrate characterized by:
   having high- and low-dislocation-density regions, with the low-dislocation-density regions defining first and second portions and the dislocation density of the low-dislocation-density regions being less than 2×10$^6$ cm$^{-2}$, and with the high-dislocation-density regions being centered on the linear dislocation-concentrating areas and sandwiched between the first and second portions of the low-dislocation-density regions; and
   maximum angular discrepancy between the crystallographic orientation of the first portion of the low-dislocation-density regions, and the crystallographic orientation of the second portion of the low-dislocation-density regions being not greater than 50 arcsec.

2. An $Al_xGa_{1-x}N$ crystal (0<x≤1) substrate as set forth in claim 1, wherein the surface area of the low-dislocation-density regions along the major face is 30% or more of the total surface area of the major face.

\* \* \* \* \*